(12) United States Patent
Weiss et al.

(10) Patent No.: US 12,051,948 B2
(45) Date of Patent: Jul. 30, 2024

(54) CIRCUIT CARRIER, (POWER) ELECTRONICS ASSEMBLY AND ELECTRICAL DRIVE DEVICE

(71) Applicant: Vitesco Technologies GMBH, Hannover (DE)

(72) Inventors: Johannes Weiss, Donaustauf (DE); Fabian Weiß, Nittendorf (DE); Johannes Katzmann, Regensburg (DE); Frank Meyer, Obertraubling (DE); Matthias Hammerl, Wolkering (DE)

(73) Assignee: Vitesco Technologies GmbH, Hannover (DE)

( * ) Notice: Subject to any disclaimer, the term of this patent is extended or adjusted under 35 U.S.C. 154(b) by 454 days.

(21) Appl. No.: 17/320,570

(22) Filed: May 14, 2021

(65) Prior Publication Data

US 2021/0273533 A1    Sep. 2, 2021

Related U.S. Application Data

(63) Continuation of application No. PCT/EP2019/081131, filed on Nov. 13, 2019.

(30) Foreign Application Priority Data

Nov. 15, 2018    (DE) .................... 10 2018 219 574.9

(51) Int. Cl.
*H02K 11/33*        (2016.01)
*B60L 53/20*        (2019.01)
(Continued)

(52) U.S. Cl.
CPC ............. *H02K 11/33* (2016.01); *B60L 53/20* (2019.02); *B60R 16/0231* (2013.01);
(Continued)

(58) Field of Classification Search
CPC ........ H02K 11/33; H02K 9/223; H02K 9/227; H02K 2211/03; B60L 53/20; B60R 16/0231
See application file for complete search history.

(56) References Cited

U.S. PATENT DOCUMENTS 10,759,467 B2    9/2020    Sonoda et al.
2011/0096495 A1  4/2011    Heise
(Continued)

FOREIGN PATENT DOCUMENTS

CN    107924892 A    4/2018
DE    102009022110 A1    2/2010
(Continued)

OTHER PUBLICATIONS

EP-489958-A1_translation (Year: 1992).*
(Continued)

*Primary Examiner* — Tulsidas C Patel
*Assistant Examiner* — Mohammed Ahmed Qureshi

(57) ABSTRACT

A circuit carrier for establishing mechanical and electrical connection for at least one (power) electronics component, having a carrier plate which has at least one passage hole, and at least one electrically and thermally conductive insert element which is arranged in the passage hole and has a first contact surface for establishing electrical and thermal connections to the component and a second contact surface, which faces away from the first contact surface, for establishing thermal connections to a cooling body. The insert element further forms a bushing and has a contact side face which is situated against the bushing and is designed for establishing an electrical and thermal connection to an electrical connecting element.

14 Claims, 1 Drawing Sheet

(51) Int. Cl.
*B60R 16/023* (2006.01)
*H02K 9/22* (2006.01)

(52) U.S. Cl.
CPC ............ *H02K 9/223* (2021.01); *H02K 9/227* (2021.01); *H02K 2211/03* (2013.01)

(56) References Cited

U.S. PATENT DOCUMENTS

| | | |
|---|---|---|
| 2014/0347821 A1 | 11/2014 | Bendani et al. |
| 2016/0347354 A1 | 12/2016 | Asao |
| 2018/0077792 A1 | 3/2018 | Horie et al. |
| 2018/0174947 A1 | 6/2018 | Mattmann |
| 2018/0201302 A1* | 7/2018 | Sonoda ............ H05K 7/20854 |

FOREIGN PATENT DOCUMENTS

| | | | |
|---|---|---|---|
| EP | 489958 A1 * | 6/1992 | ......... H01L 23/4006 |
| EP | 0489958 A1 | 6/1992 | |
| EP | 0489958 B1 | 3/1994 | |
| EP | 3352362 A1 | 7/2018 | |
| WO | 2014091000 A2 | 6/2014 | |

OTHER PUBLICATIONS

Chinese Office Action Dated Dec. 19, 2023 (Year: 2023).*
Chinese Office Action Dated Dec. 19, 2023_translated (Year: 2023).*
International Search Report and Written Opinion dated Mar. 11, 2019 from corresponding International Patent Application No. PCT/EP2019/081131.
German Search Report dated Sep. 3, 2022 for corresponding German Patent Application No. 10 2018 219 574.9.

* cited by examiner

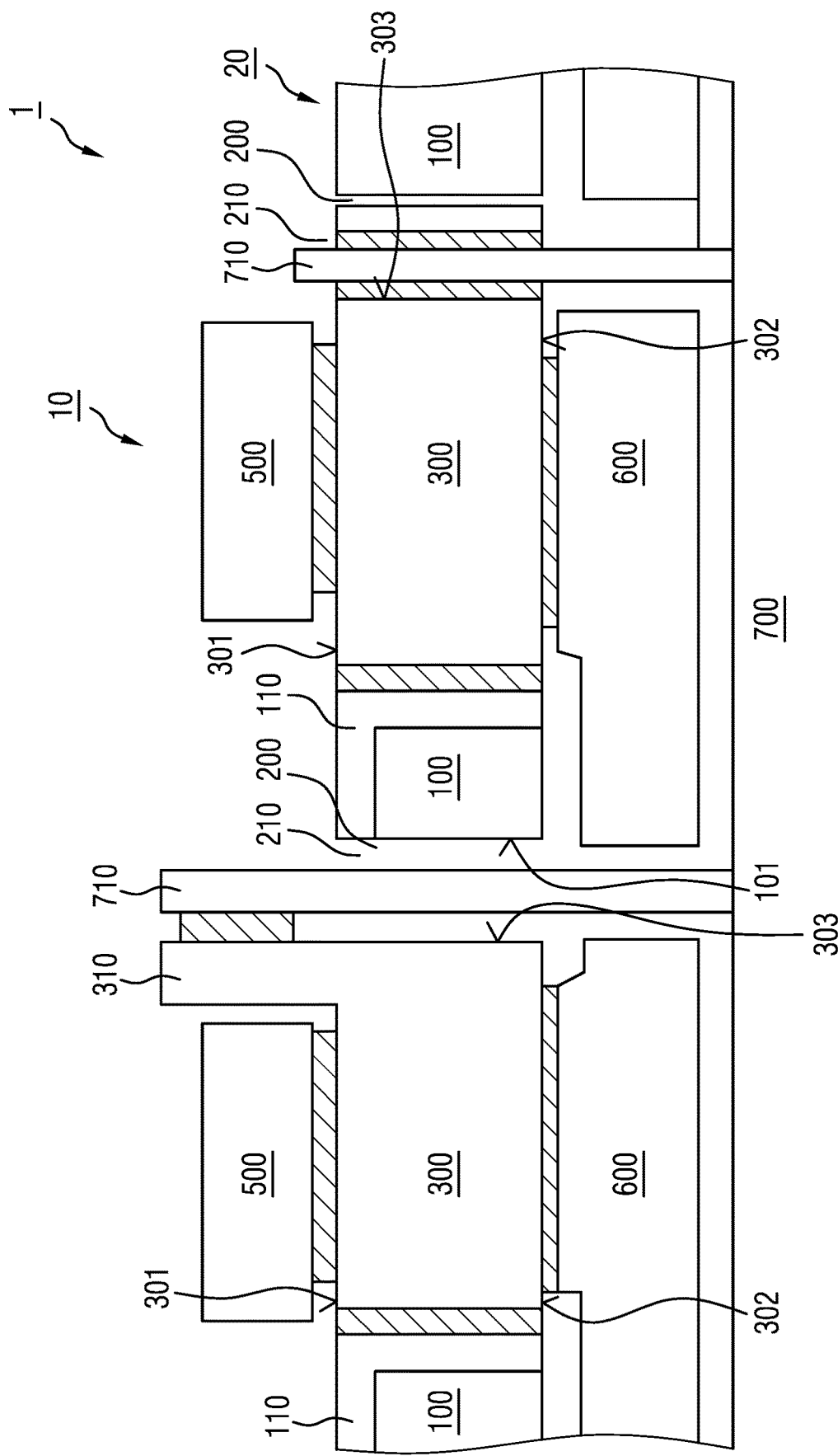

CIRCUIT CARRIER, (POWER) ELECTRONICS ASSEMBLY AND ELECTRICAL DRIVE DEVICE

CROSS-REFERENCE TO RELATED APPLICATIONS

This application claims priority to PCT Application PCT/EP2019/081131, filed Nov. 13, 2019, which claims priority to German Patent Application No. DE 10 2018 219 574.9, filed Nov. 15, 2018. The disclosures of the above applications are incorporated herein by reference.

FIELD OF THE INVENTION

The present invention relates to a circuit carrier, and also to a (power) electronics assembly and to an electrical drive device, for a hybrid electric vehicle/electric vehicle having a circuit carrier.

BACKGROUND OF THE INVENTION

Power electronics assemblies and, respectively, electrical drive devices, in particular for hybrid electric vehicles/electric vehicles, have electrically powered components, such as electrically powered elements and/or electrical machines for example, between which high currents with a current intensity of above 10 amperes, even above 100 amperes, flow for functional reasons during operation of the power electronics assemblies and, respectively, of the drive devices. For functional reasons or, in particular, owing to the high currents, the electrically powered components further have high power losses and therefore give off a large amount of waste heat which has to be promptly dissipated by the components once it is produced.

The general requirement here is for the power electronics assemblies and, respectively, the electrical drive devices to be produced in a cost-effective manner.

SUMMARY OF THE INVENTION

Therefore, the object of the present application is to provide a possible way in which a (power) electronics assembly and, respectively, an electrical drive device may be produced in a cost-effective manner.

This object is achieved by subjects described herein. Other refinements are also described.

According to a first aspect of the invention, a circuit carrier for establishing a mechanical and electrical connection for at least one (power) electronics (or electrical (electrically powered)) component is provided.

The circuit carrier has at least one carrier plate which has at least one passage hole. The circuit carrier has at least one electrically and thermally conductive insert element which is arranged in the passage hole of the carrier plate. The insert element has a first contact surface for establishing (direct, areally extending) electrical and thermal connections to the component and a second contact surface, which faces away from the first contact surface, for establishing (likewise direct, areally extending) thermal connections to a cooling body. In this case, the insert element further forms a bushing and additionally has a contact side face which is situated against the bushing and is designed for establishing a (likewise direct, areally extending) electrical and thermal connection to an electrical connecting element.

Here, a circuit carrier and a carrier plate are carriers for (power) electronics components. They are used for mechanical fastening and electrical connection for the (power) electronics components.

Owing to the above-described design, the insert element combines two functions, namely transmission of power and transportation of heat. By use of the two contact surfaces and the contact side face, the insert element forms areally extending contact or transmission areas for efficient transmission of power and at the same time efficient transportation of heat. In this case, the current-carrying circuit components, that is to say the (power) electronics component and the electrical connecting element, may be electrically connected (directly and with low impedance) to one another via the insert element. The circuit components, which themselves generate a large amount of waste heat or are under high thermal load, may furthermore be (directly) thermally connected to the heat sink, namely the cooling body, via the same insert element. The transmission of power between the current-carrying circuit components and the transportation of heat from these circuit components to the heat sink therefore take place directly by one and the same insert element. In this case, the insert element differs from a plated through-hole generally known in printed circuit board technology in that, in the insert element, all thermal and electrical contacts to the abovementioned circuit components and to the heat sink are established directly and via extended contact surfaces and an extended contact side face. In this case, the insert element is fitted on the carrier plate during a fitting process by a generally known fitting machine, other electrical components also being fitted on the carrier plate during the fitting process.

Here, the expression "directly" means that the electrical and thermal connections are established (in one embodiment only) via low-impedance and thermally conductive direct connection, by soldering, welding or adhesive bonding for example, without or with only negligibly low electrical or thermal resistance.

Owing to the use of the insert element which combines two functions, namely the transmission of power and the transportation of heat, components which are otherwise required exclusively for transmitting power or exclusively for transporting heat may be saved. As a result, costs are reduced.

This provides a possible way of producing a (power) electronics assembly and, respectively, an electrical drive device in a cost-effective manner.

For example, the insert element has at least one contact portion for establishing the electrical and thermal connection to the connecting element, the contact portion extending beyond the first and/or the second contact surface. In this case, the contact side face is at least partially formed on the contact portion.

For example, the bushing extends through the insert element. As an alternative, the bushing is formed, for example, between the insert element and a side face of the carrier plate and within the passage hole.

For example, the circuit carrier further has at least one conductor track which is formed between two sides of the carrier plate and/or on at least one side of the carrier plate and is electrically and thermally connected to the insert element.

According to a second aspect of the invention, a (power) electronics assembly is provided.

The electronics assembly has at least one above-described circuit carrier and at least one (power) electronics component which is arranged on the first contact surface of the insert element and is electrically and thermally connected to the first contact surface and therefore to the insert element.

For example, the component is designed as a power semiconductor component or a power semiconductor switch.

For example, the electronics assembly further has at least one cooling body which is arranged on the second contact surface of the insert element and is thermally connected to the second contact surface and therefore to the insert element.

For example, the electronics assembly further has at least one electrical connecting element which extends at least partially through the bushing and is electrically and thermally connected to the contact side face and therefore to the insert element.

For example, the connecting element is soldered or welded onto the contact side face.

As an alternative, the connecting element is crimped, pressed or screwed to the insert element. For this purpose, the contact portion is embodied as a pipe cross section but also in a U shape. As an alternative, a threaded bore is provided in the insert element and then a bore is provided in the connecting element. As an alternative, a "cable shoe" may also be attached to the end of the connecting element.

For example, the connecting element is designed as a connection of a motor phase of an electrical machine.

According to a third aspect of the invention, an electrical drive device, for a hybrid electric vehicle/electric vehicle, is provided.

The drive device has at least one above-described electronics assembly and at least one electrical machine, wherein the electrical machine has at least one connecting element as a connection of a motor phase and is electrically and thermally connected to the electronics assembly via the connecting element.

For example, the drive device further has an inverter which has the above-described electronics assembly as a component. As an alternative or in addition to the inverter, the drive device may have, for example, a DC/DC converter which has the above-described electronics assembly as a component.

Other refinements of the above-described circuit carrier, provided that they may otherwise be transferred to the abovementioned (power) electronics assembly and the abovementioned electrical drive device, may also be regarded as refinements of the (power) electronics assembly and of the drive device.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

An exemplary embodiment of the invention will be explained in more detail below with reference to the accompanying drawing, in which: the single FIGURE shows a schematic cross-sectional illustration of a portion of an electrical drive device 1 of a hybrid electric vehicle/electric vehicle according to the exemplary embodiment of the invention.

DETAILED DESCRIPTION OF THE PREFERRED EMBODIMENTS

The following description of the preferred embodiment(s) is merely exemplary in nature and is in no way intended to limit the invention, its application, or uses.

The electrical drive device 1 has an electrical machine 700 and an inverter having a power electronics assembly 10.

In this embodiment, the electrical machine 700 is designed as a three-phase synchronous machine and has three motor phases and accordingly three phase current connections 710 for the motor phases, the machine 700 being electrically and thermally connected to the power electronics assembly 10 via the phase current connections.

In this embodiment, the power electronics assembly 10 is designed as a power output stage of the inverter and has a circuit carrier 20 having a carrier plate 100 and power semiconductor switches 500 as some electronic components and also has a cooling body 600 for cooling the power electronics assembly 10. In this case, the power semiconductor switches 500 are designed as surface-mounted devices (SMD) and are surface-mounted on the circuit carrier 20 or the carrier plate 100 via contact surfaces.

The carrier plate 100 has conductor tracks 110 for establishing an electrical connection for the power semiconductor switches 500 which are formed on both sides of the carrier plate 100 or between the two sides of the carrier plate 100 and therefore in the carrier plate 100.

In addition, the carrier plate 100 has three passage holes 200 in each of which an electrically and thermally conductive insert element 300 is arranged.

In this case, the insert elements 300 are formed from copper or a copper alloy and are accordingly highly electrically and thermally conductive. The insert elements 300 are soldered, welded or electrically and thermally connected in a similar way to the conductor tracks 110. The insert elements 300 each have a first contact surface 301 for establishing an electrical and thermal connection to at least one of the abovementioned power semiconductor switches 500. In this case, the power semiconductor switches 500 rest by way of the contact surfaces thereof on the first contact surface 301 of the respective corresponding insert elements 300 and are electrically and thermally connected to the insert elements. For this purpose, the power semiconductor switches 500 are soldered, for example, onto the first contact surface 301 of the respective corresponding insert elements 300. The insert elements 300 further each have a second contact surface 302, which second contact surfaces are situated on a side of the respective insert elements 300 which faces away from the first contact surface 301 and are used for establishing thermal connection to the abovementioned cooling body 600. In this case, the cooling body 600, by way of its contact surface, rests on the second contact surface 302 of the respective insert elements 300 and is physically and thermally connected to the insert elements 300, for example, by an electrically insulating and thermally conductive adhesive layer.

The insert elements 300 further each form a bushing 210. In this case, the bushings 210 are designed in the form of further relatively small passage holes which extend through the respective insert elements 300 within the respective insert elements 300, as is the case in the insert element 300 on the left-hand side in the FIGURE. As an alternative, the bushings 210 are designed in the form of gaps (or intermediate spaces) between the respective insert elements 300 and side faces 101 of the carrier plate 100 within the respective corresponding passage holes 200, as is the case in the insert element 300 on the right-hand side in the FIGURE. The bushings 210 each have a contact side face 303, which contact side faces are situated against the bushings 210. Some of the insert elements 300 each have a contact portion 310, which contact portions extend beyond the first contact surface 301 of the respective corresponding insert elements 300 and are designed for establishing the electrical and thermal connections to the phase current connections 710, as is the case in the insert element 300 on the right-hand side in the FIGURE. In this case, the contact side faces 303 of some of the insert elements 300 are at least partially formed on the contact portions 310 of the respective corresponding insert elements 300.

The phase current connections 710 of the electrical machine 700 are at least partially routed through the bushings 210 and are soldered or welded onto the contact side faces 303 of the respective corresponding insert elements 300 or their respective contact portions 310. As a result, the phase current connections 710 and, respectively, the electrical machine 700 are electrically connected to the respective corresponding power semiconductor switches 500 and thermally connected to the cooling body KK via the respective insert elements 300.

The insert elements 300 combine two functions, namely the transmission of power between the respective corresponding conductor tracks 110, the respective corresponding power semiconductor switches 500 and the respective corresponding phase current connections 710 and the transportation of heat from the respective corresponding conductor tracks 110, the respective corresponding power semiconductor switches 500 and the respective corresponding phase current connections 710 and therefore from the electrical machine 700.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A circuit carrier for establishing a mechanical and electrical connection for at least one (power) electronics component, comprising:
   carrier plate having at least one passage hole;
   at least one electrically and thermally conductive insert element which is arranged in the passage hole, the insert element further comprising:
      a first contact surface for establishing electrical and thermal connections to the component; and
      a second contact surface, which faces away from the first contact surface, for establishing thermal connections to a cooling body;
      at least one bushing formed as part of the insert element;
   an electrical connecting element;
   wherein the insert element and has a contact side face which is situated against the bushing such that the insert element establishes an electrical and thermal connection to the electrical connecting element.

2. The circuit carrier of claim 1, the insert element further comprising:
   at least one contact portion for establishing the electrical and thermal connection to the connecting element, the contact portion extending beyond at least one of the first contact surface or the second contact surface;
   wherein the contact side face is at least partially formed on the contact portion.

3. The circuit carrier of claim 1, wherein the bushing is formed between the insert element and a side face of the carrier plate within the passage hole.

4. The circuit carrier of claim 1, wherein the bushing extends through the insert element.

5. The circuit carrier of claim 1, further comprising at least one conductor track which is formed on at least one side of the carrier plate and is electrically and thermally connected to the insert element.

6. The circuit carrier of claim 1, further comprising at least one conductor track which is formed between two sides of the carrier plate and is electrically and thermally connected to the insert element.

7. A (power) electronics assembly, comprising:
   at least one (power) electronics component;
   at least one circuit carrier, further comprising:
      carrier plate having at least one passage hole;
      at least one electrically and thermally conductive insert element which is arranged in the passage hole, the insert element further comprising:
         a first contact surface for establishing electrical and thermal connections to the component;
         a second contact surface, which faces away from the first contact surface, for establishing thermal connections to a cooling body;
         a bushing formed as part of the insert element, the bushing having a contact side face which is situated against the bushing;
         at least one electrical connecting element which extends at least partially through the bushing and is electrically and thermally connected to the contact side face;
   wherein the component is arranged on the first contact surface of the insert element and is electrically and thermally connected to the first contact surface.

8. The electronics assembly of claim 7, the component further comprising one selected from the group consisting of a power semiconductor component and a power semiconductor switch.

9. The electronics assembly of claim 7, further comprising at least one cooling body which is arranged on the second contact surface of the insert element and is thermally connected to the second contact surface.

10. The electronics assembly of claim 7, wherein the connecting element is soldered or welded onto the contact side face.

11. The electronics assembly of claim 7, wherein the connecting element is crimped, pressed or screwed to the insert element.

12. The electronics assembly of claim 7, the connecting element further comprising a connection of a motor phase of an electrical machine.

13. An electrical drive device, comprising:
   at least one electronics assembly, the electronics assembly further comprising:
      at least one (power) electronics component;
      at least one circuit carrier, further comprising:
         carrier plate having at least one passage hole;
         at least one electrically and thermally conductive insert element which is arranged in the passage hole, the insert element further comprising:
            a first contact surface for establishing electrical and thermal connections to the component;
            a second contact surface, which faces away from the first contact surface, for establishing thermal connections to a cooling body;

a bushing formed by the insert element, the bushing having a contact side face which is situated against the bushing such that the insert element establishes an electrical and thermal connection to an electrical connecting element;
wherein the component is arranged on the first contact surface of the insert element and is electrically and thermally connected to the first contact surface;
at least one electrical machine having the electrical connecting element as a connection of a motor phase of the electrical machine, the electrical connecting element at least partially extending through the bushing;
wherein the electrical machine is electrically and thermally connected to the electronics assembly via the connecting element.

14. The drive device of claim 13, further comprising an inverter, wherein the electronics assembly forms part of the inverter.

\* \* \* \* \*